(12) United States Patent
Choi et al.

(10) Patent No.: US 7,912,520 B2
(45) Date of Patent: Mar. 22, 2011

(54) MOBILE PHONE

(75) Inventors: Byung-Sung Choi, Gyeonggi-Do (KR); Sang-Ki Hong, Gyeonggi-Do (KR); Sung-Min Kim, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 861 days.

(21) Appl. No.: 11/806,634

(22) Filed: Jun. 1, 2007

(65) Prior Publication Data

US 2008/0020813 A1    Jan. 24, 2008

Related U.S. Application Data

(60) Provisional application No. 60/879,014, filed on Jan. 8, 2007.

(30) Foreign Application Priority Data

| Jul. 19, 2006 | (KR) | ............ 10-2006-0067671 |
| Aug. 21, 2006 | (KR) | ............ 10-2006-0079071 |
| Nov. 3, 2006 | (KR) | ............ 10-2006-0108572 |

(51) Int. Cl.
    *H04M 1/00* (2006.01)
(52) U.S. Cl. ............ 455/575.1; 361/771; 174/257; 379/330; 455/128
(58) Field of Classification Search ............ 455/575.3, 455/575.1, 128, 90.3; 361/771; 324/761; 439/188
See application file for complete search history.

(56) References Cited

U.S. PATENT DOCUMENTS

| 5,235,492 | A | 8/1993 | Humbert et al. |
| 5,392,461 | A | 2/1995 | Yokoyama |
| 6,117,526 | A | 9/2000 | Marks |
| 6,299,467 | B1 * | 10/2001 | Chien ............ 439/188 |
| 6,490,438 | B1 | 12/2002 | Wu |
| 2002/0006809 | A1 * | 1/2002 | Kubo et al. ............ 455/550 |
| 2002/0019252 | A1 | 2/2002 | Kuroda |
| 2002/0114447 | A1 * | 8/2002 | Ooya et al. ............ 379/433.09 |
| 2003/0045246 | A1 | 3/2003 | Lee et al. |
| 2004/0090737 | A1 | 5/2004 | Shimura et al. |
| 2004/0209576 | A1 | 10/2004 | Lee |
| 2004/0229668 | A1 | 11/2004 | Lin |
| 2005/0003871 | A1 | 1/2005 | Shiue et al. |
| 2005/0054399 | A1 | 3/2005 | Buris |
| 2005/0059444 | A1 | 3/2005 | Martinez et al. |
| 2005/0079891 | A1 | 4/2005 | Lee |
| 2005/0243486 | A1 * | 11/2005 | Wingfield et al. ............ 361/56 |
| 2005/0282593 | A1 | 12/2005 | Spence et al. |
| 2006/0142072 | A1 | 6/2006 | Krenz et al. |

(Continued)

FOREIGN PATENT DOCUMENTS

CN    1264237 A    8/2000

(Continued)

*Primary Examiner* — Edward Urban
*Assistant Examiner* — Golam Sorowar
(74) *Attorney, Agent, or Firm* — Birch, Stewart, Kolasch & Birch, LLP

(57) ABSTRACT

A mobile phone having a body including a ground portion, a cover of a metallic material coupled to the body, the cover forming an exterior surface of the mobile phone, and a grounding unit electrically connecting the ground portion of the body to the cover, the grounding unit being disposed on one of facing surfaces of the body and the cover. Since the body and the metallic cover are electrically and stably connected with each other, a wireless communication characteristic of the mobile phone is prevented from being lowered.

22 Claims, 9 Drawing Sheets

U.S. PATENT DOCUMENTS

| | | | |
|---|---|---|---|
| 2007/0021156 A1* | 1/2007 | Hoong et al. | 455/575.1 |
| 2007/0152689 A1* | 7/2007 | Lee et al. | 324/761 |
| 2007/0195512 A1* | 8/2007 | Konno | 361/771 |
| 2008/0102351 A1* | 5/2008 | Lee | 429/65 |

FOREIGN PATENT DOCUMENTS

| | | |
|---|---|---|
| CN | 2546462 Y | 4/2003 |
| CN | 2572679 Y | 9/2003 |
| CN | 1777049 A | 5/2006 |
| EP | 0522538 A2 | 1/1993 |
| EP | 0 932 288 A1 | 7/1999 |
| EP | 1381204 A2 | 1/2004 |
| EP | 1408580 A2 | 4/2004 |
| JP | 2000-349874 A | 12/2000 |
| JP | 2002-319808 A | 10/2002 |
| JP | 2003-158562 A | 5/2003 |
| JP | 2004-214969 A | 7/2004 |
| KR | 2001-0086654 A | 9/2001 |
| RU | 2 231 108 C2 | 6/2004 |
| TW | I243574 B | 11/2005 |
| WO | WO-01/15617 A1 | 3/2001 |

\* cited by examiner

MOBILE PHONE

CROSS REFERENCE TO RELATED APPLICATIONS

This application claims priority to U.S. Provisional Application No. 60/879,014, filed on Jan. 8, 2007, Korean Application No. 10-2006-0067671, filed on Jul. 19, 2006, Korean Application No. 10-2006-0079071, filed on Aug. 21, 2006, and Korean Application No. 10-2006-0108572, filed on Nov. 3, 2006, which are all herein incorporated by reference in their entireties.

BACKGROUND OF THE INVENTION

1. Field of the Invention

The present invention relates to a mobile phone, and more particularly, to a mobile phone having a cover formed of a metallic material.

2. Description of Related Art

Generally, a mobile phone performs a wireless communication function in addition to various other functions in correspondence with a user's demand, such as play music, videos, and take pictures. At the same time that more functions are demanded by a user, the mobile phone is becoming slimmer so as to enhance a portable characteristic and to match a user's desire for smaller devices.

Electronic components used in the mobile phone are integrated in an optimum arrangement to minimize space. Also, a cover, on which the electronic components are mounted or for covering the electric components, is formed of a thin material to assist in minimizing the size of the mobile phone.

A representative material of the cover includes metal, which can be formed to have a thin profile and still maintain mechanical integrity. The metallic cover has a strong endurance against an external impact or scratch, and has a simple appearance, thereby being more utilized. However, when a metallic cover is used with a mobile phone, a wireless communication characteristic is lowered due to the metallic characteristic of the cover.

BRIEF SUMMARY OF THE INVENTION

Therefore, there is a need for a mobile phone capable of enhancing an appearance thereof by providing a cover formed of a thin and strong metal material, and capable of preventing a lowering of a wireless communication characteristic thereof due to the metallic cover.

To achieve these and other advantages and in accordance with the purpose of the present invention, as embodied and broadly described herein, there is provided a mobile phone having a body including a ground portion, a cover formed of a metallic material coupled to the body, and a grounding unit electrically connecting the ground portion of the body to the cover. The cover forms an exterior surface of the mobile phone and the grounding unit is disposed on one of facing surfaces of the body and the cover.

According to one aspect of the present invention, the cover is fixed or detachably coupled to the body. The cover may be a battery cover detachably coupled to the body and covering a battery. A ground portion is formed at a circuitry supporting substrate mounted in the body, and the grounding unit electrically connects the ground portion to the metallic cover. The grounding unit is disposed on one of facing surfaces of the body and the cover, and contacts another of the body and the cover by being extended, thereby electrically connecting the body and the cover to each other. Accordingly, a lowering of a wireless communication characteristic of the mobile phone due to the metallic cover is prevented. Furthermore, an influence of a static electricity on the mobile phone is minimized.

According to another aspect of the present invention, the cover and the body are electrically connected to each other by interposing a terminal unit between the cover and the ground portion. The terminal unit may be a card socket mounted at the body for receiving a card. The card socket may be provided with a metallic holder connected to the ground portion.

According to another aspect of the present invention, the grounding unit includes an attachment portion located on an inner surface of the cover and an elastic extension portion extending from the attachment portion towards the terminal unit. The elastic extension portion may be elastically displaced towards the cover when contacting the terminal unit. A protrusion is extending towards the terminal unit, thereby enhancing the electric connection between the cover and the terminal unit. The grounding unit may be a metallic plate divided into at least the attachment portion and the elastic extension portion by at least one slot. The attachment portion may be fixed to the cover by welding.

According to another aspect of the present invention, the grounding unit includes at least one pogo-pin mounted at the body. The pogo pin has one end contacting the ground portion and another end elastically displaced towards the cover. The grounding unit may include a plurality of pogo-pins having different heights. In this manner, the connection between each of the pogo-pins and the cover may be more stabilized despite changes in size of the gaps between the cover and the body.

According to another aspect of the present invention, a switch for electrically connecting or disconnecting the cover and the ground to or from each other may be included. More specifically, when the switch is in the on position, the cover and ground portion are electrically connected to each other, and when the switch is in the off position, the cover and ground are electrically disconnected from each other. The switch is moveable between the on and off position is response to a wireless communication characteristic of the mobile phone. For example, the switch may be in the on position when the mobile phone is in a non-communication state to maintain the electric connection between the ground and the cover to resist the buildup of static electricity. The switch may be in the off position when the mobile phone is in a charge state to release the electric connection between the ground and the cover to resist transferring current leakage to the cover. A controller may electrically control the switch.

According to another aspect of the present invention, an insulating layer is formed at an inner surface of the cover facing the body. When the grounding unit is disposed at the cover, it is arranged on the insulating layer. The insulating layer may be formed by coating an insulating material or attaching an insulating tape. The insulating layer serves to prevent a current leakage towards outside without influencing a wireless communication characteristic.

The foregoing and other objects, features, aspects and advantages of the present invention will become more apparent from the following detailed description of the present invention when taken in conjunction with the accompanying drawings.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE INVENTION

Reference will now be made in detail to the exemplary embodiments of the present invention, examples of which are illustrated in the accompanying drawings.

Hereinafter, a mobile phone according to the present invention will be explained in more detail.

Figure 1:
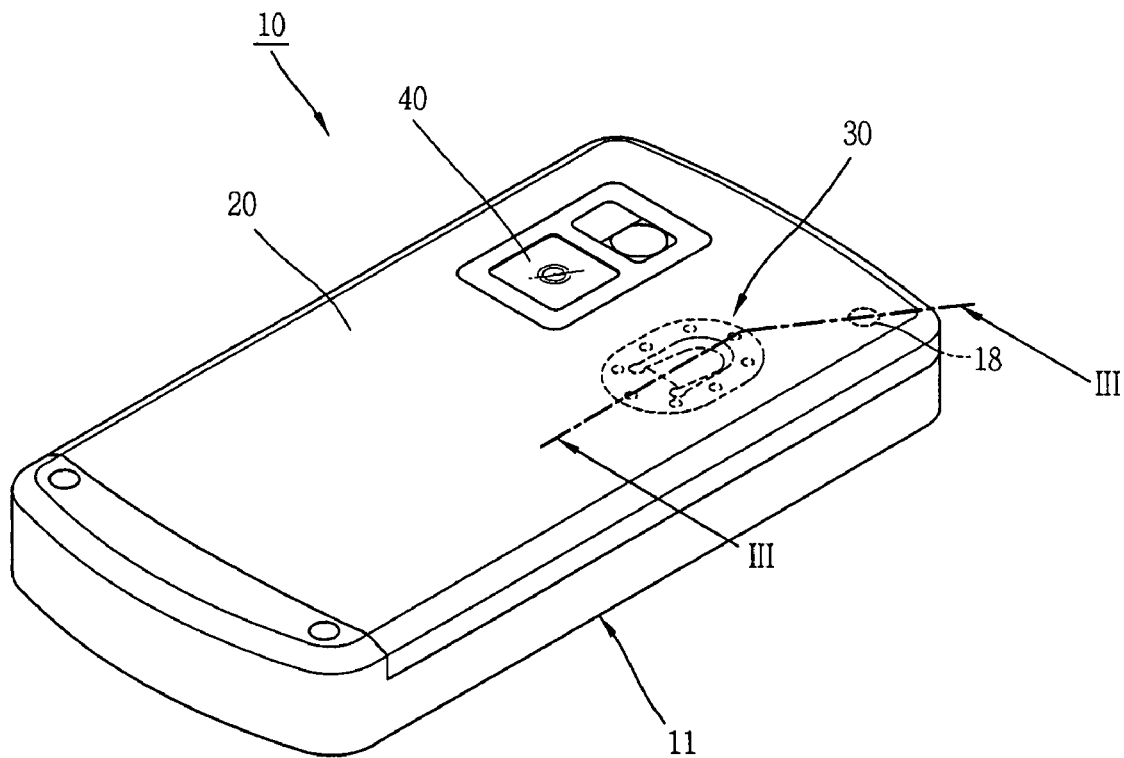
FIG. 1 is a perspective view showing a mobile phone according to a first embodiment of the present invention.

FIG. 1 is a perspective view showing an appearance of a mobile phone 10 according to a first exemplary embodiment of the present invention. While the description that follows is directed to mobile phones, the present invention may be applied to other portable devices including, but not limited to, PDAs, portable game devices, portable music players, or portable calculators.

As shown in FIG. 1, the mobile phone 10 comprises a body 11 and a cover 20 formed of a metallic material for covering at least one surface of the body 11. In the exemplary embodiment shown, the mobile phone is a bar type phone. However, the present invention may be applied to not only bar type phones, but also folder type or slide type phones in which two components are connected to each other such that they move relative to one another, or a combination of two or more types thereof. Because of the metallic cover 20, the mobile phone 10 can have a smooth appearance without an additional reinforcing structure or shape.

Figure 3:
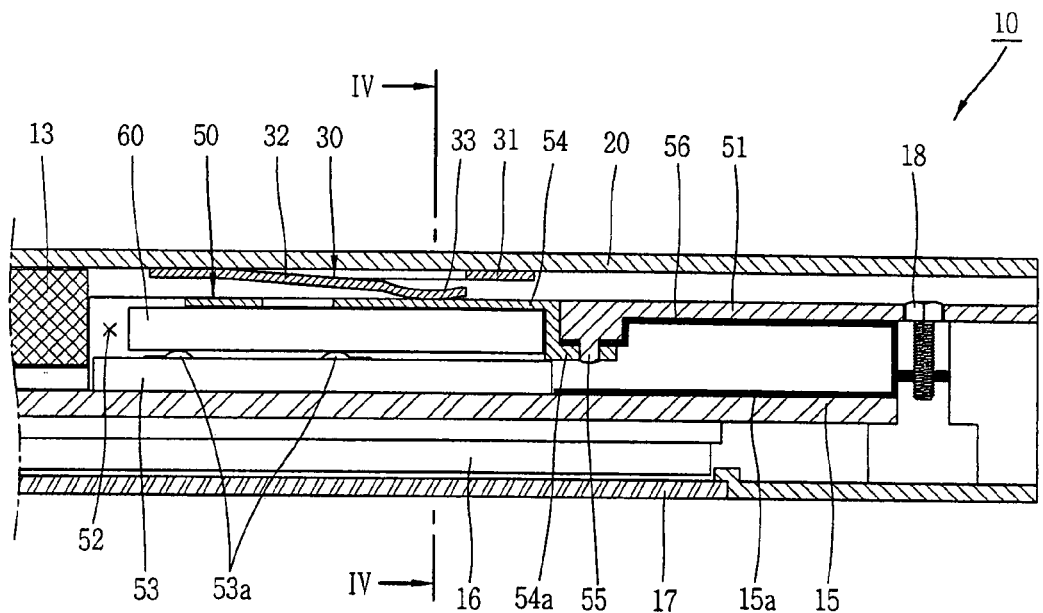
FIG. 3 is a sectional view taken along line III-III of FIG. 1.

A grounding unit 30 electrically connects a ground portion 15a of the body 11, as best seen in FIG. 3, to the metallic cover 20 and is disposed at an inner surface of the cover 20. A camera 40 disposed at the body 11 is exposed through an opened portion or through hole 23, of the cover 20. While the grounding unit 30 is shown as formed on the metallic cover 20, it is understood that the grounding unit could be placed on the body and arranged to contact the metallic cover 20.

Figure 2:
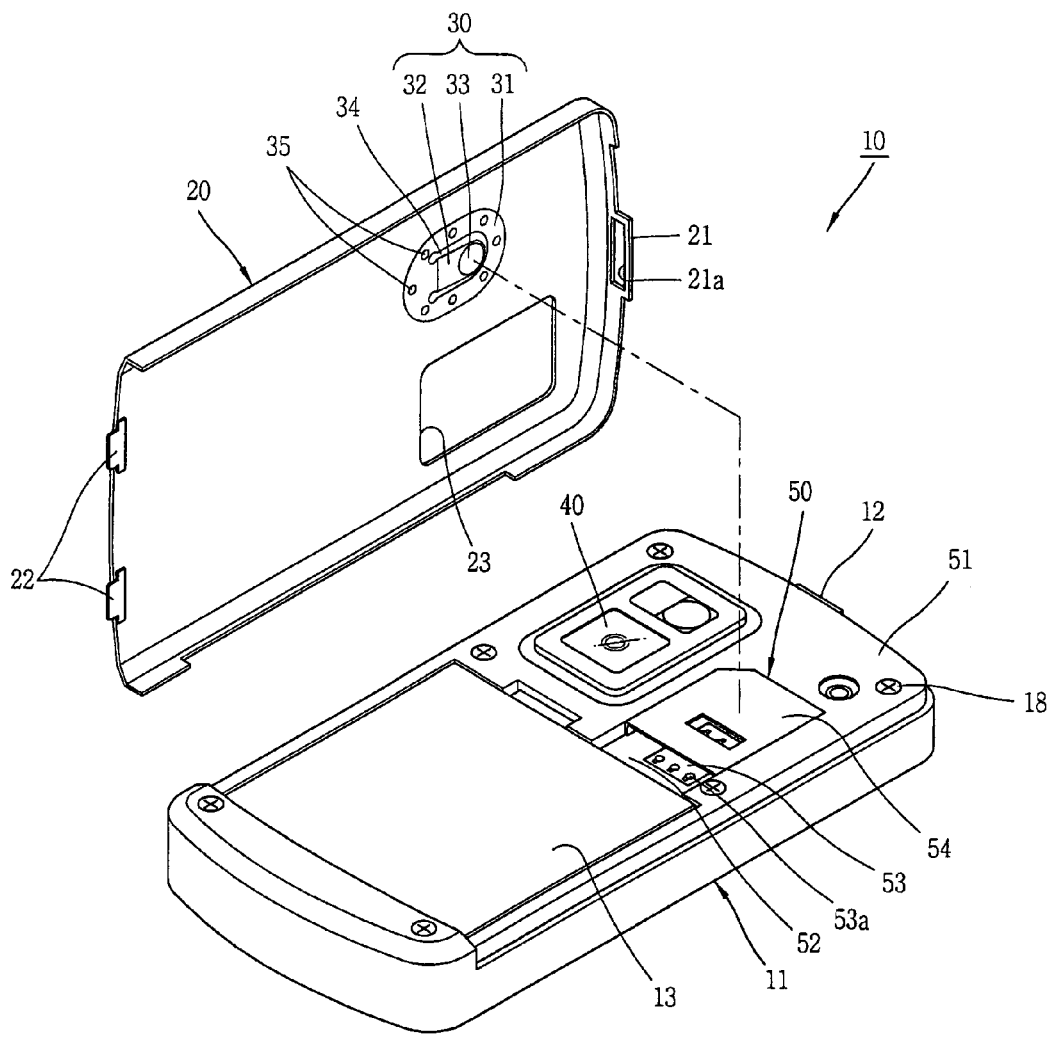
FIG. 2 is a disassembled perspective view showing a state where a cover is separated from a body of the mobile phone of FIG. 1.

As shown in FIG. 2, the metallic cover 20 is detachably coupled to the body 11, and covers a battery 13 detachably mounted at the body 11. Accordingly, in this exemplary embodiment, the cover 20 is also referred to as a battery cover. Detaching the metallic cover 20 from the body 11 is executed by connecting or disconnecting a first coupling portion and a second coupling portion to/from each other. The first coupling portion includes a stopping member 22 disposed at a lower end of the cover 20 and a fitting groove formed in the body 11 (not shown). The second coupling portion includes a hook 21 having a through hole 21a disposed at an upper end of the cover 20 and a locking member 12 formed at the body 11. While the cover 20 has been described as a battery cover, cover 20 may be other types of covers fixedly coupled to the body 11 using conventional techniques.

In order to stably maintain an electric connection between the ground portion 15a of the body 11 and the metallic cover 20, the grounding unit 30 is formed to elastically contact the body 11.

A portion of the body 11 to which the grounding unit 30 contacts may be implemented as a terminal unit of a metallic material connected to the ground 15a of the body 11. Preferably, as the terminal unit, a card socket 50 having a metallic holder 54 may be provided. A card 60 to be received in the card socket 50 may be a user identification card, a memory card, or any other suitable card used by mobile phones. It is understood that other portions of the body could be used in place of the terminal unit to connect the grounding unit to a ground portion.

Accordingly, when the card socket 50 is utilized as the terminal unit, the conventional metallic member may be used as a conductive passage contacting the grounding unit 30, thereby requiring no additional metallic member at the body 11. As a result, an entire size of the mobile phone is prevented from being increased, and the number of components and fabrication cost can be reduced.

As shown in FIG. 2, the card socket 50 includes a card mounting groove 52 having a certain depth for receiving a card (not shown) in a housing 51 of the body 11, a connector 53 installed at the card mounting groove 52 and having a plurality of terminals 53a, and the metallic holder 54 fixed to an upper portion of the card mounting groove 52 for maintaining a fixed state of the card in the card mounting groove 52.

To provide an electric connection between the card socket 50 and the cover 20, the grounding unit 30 is disposed at the cover 20 so as to contact the metallic holder 54. More specifically, the grounding unit 30 includes an attachment portion 31 attached to the cover 20, and an elastic extension portion 32 extending from the attachment portion 31 and contacting the holder 54. The elastic extension portion 32 extends from the attachment portion 31 with inclination towards the holder 54, and is elastically displaced towards the cover 20 by the holder 54 when the cover 20 is coupled to the body 11. Accordingly, an electric connection between the cover 20 and the holder 54 can be more stably maintained.

Preferably, the grounding unit 30 is formed of a thin metallic plate so as to enhance a coupling characteristic to the cover 20. The metallic plate is provided with a slot 34 at the center thereof. As the slot 34 has an arc shape, an outer piece of the metallic plate serves as the attachment portion 31 and an inner piece of the metallic plate serves as the elastic extension portion 32. The slot 34 may be implemented in plurality. Furthermore, the attachment portion 31 and the elastic extension portion 32 may be composed of a plurality of pieces, respectively.

The elastic extension portion 32 includes a protrusion 33 extending towards the holder 54 so as to enhance a contact between the holder 54 and the elastic extension portion 32. The attachment portion 31 may be attached to the cover 20 by welding such as a spot welding method or a laser welding method. As shown in FIG. 2, the attachment portion 31 has been welded to the cover 20 at a plurality of positions by a plurality of welding spots 35. Accordingly, the grounding unit 30 is implemented as one simple component to be coupled to the cover 20.

Referring to FIG. 2, the cover 20 is formed so as to cover the battery 13 and the card socket 50. In addition, the cover 20 is configured to expose a lens, a flash, or other components of the camera 40 via through hole 23. The cover 20 may be formed of one metallic material to provide a continuous appearance. In addition, the ground 15a is connected to the cover 20 by the grounding unit 30, thereby preventing a lowering of a wireless communication characteristic due to the cover 20. Furthermore, protection against static electricity buildup for the mobile phone is also improved.

Figure 4:
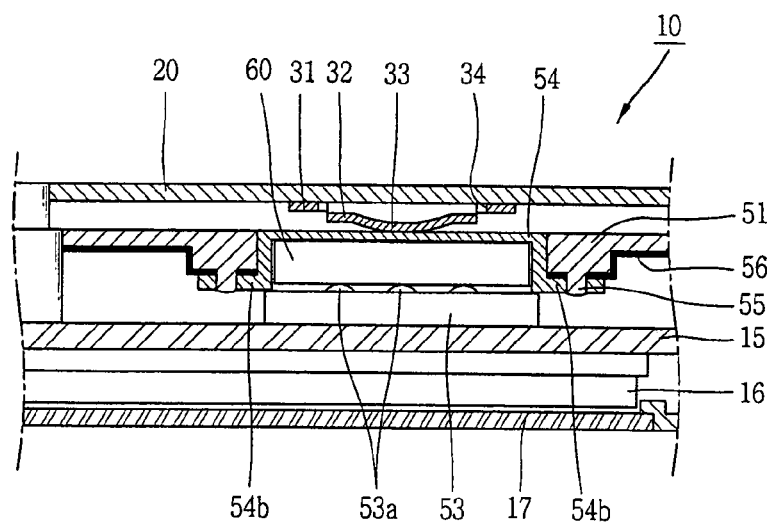
FIG. 4 is a sectional view taken along line IV-IV of FIG. 3.

As shown in FIGS. 3 and 4, edge portions 54a and 54b of the holder 54 come in contact with an inner surface of the housing 51, which has a conductive film 56 applied thereto. The edge portions 54a and 54b are fixed to the housing 51 when a fixing protrusion 55 inserted thereinto comes in contact with the conductive film 56. The conductive film 56 is connected to the ground 15a of a circuitry supporting substrate 15, such as a printed circuit board, and the circuitry supporting substrate 15 contacts the housing 51 at a portion fixed by a screw 18.

The holder 54 of the card socket 50 is electrically connected to the ground 15a of the circuitry supporting substrate 15 through the conductive film 56 and comes in contact with the grounding unit 30 when the cover 20 is coupled to the body 11. More specifically, when the elastic extension portion 32 and the protrusion 33 of the grounding unit 30 contact the holder 54, they are elastically displaced. Accordingly, a conductive state between the cover 20 and the ground 15a can be stably maintained.

As also shown in FIGS. 3 and 4, the mobile phone 10 includes a display 16 mounted on an surface of the body 11 opposite the cover 20 for displaying visual information. Window 17 covers the display 16 and forms an appearance of the mobile phone.

Figure 5:
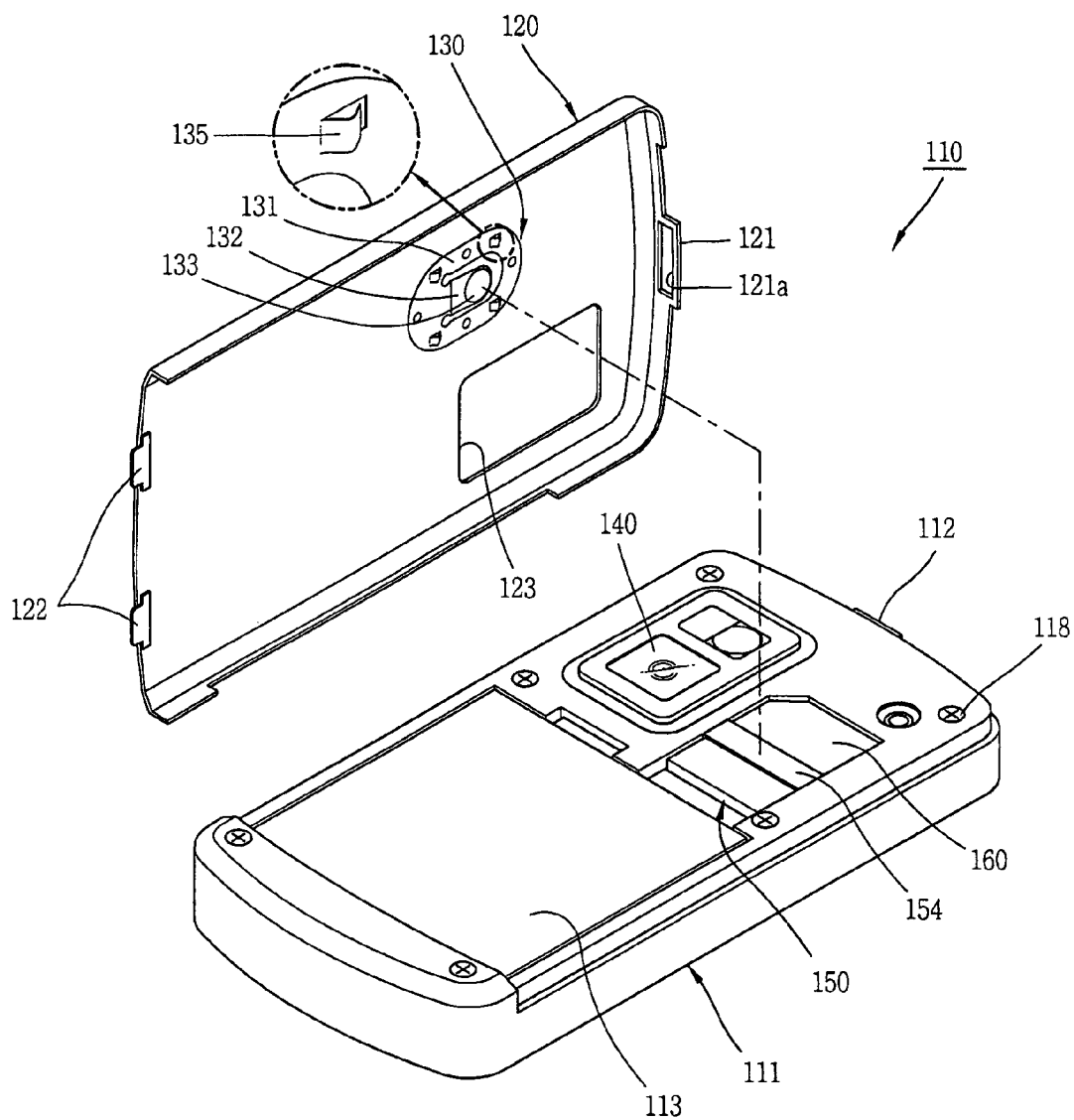
FIG. 5 is a disassembled perspective view showing a state where a cover is separated from a body of the mobile phone according to a modification of the first exemplary embodiment of the present invention.
Figure 6:
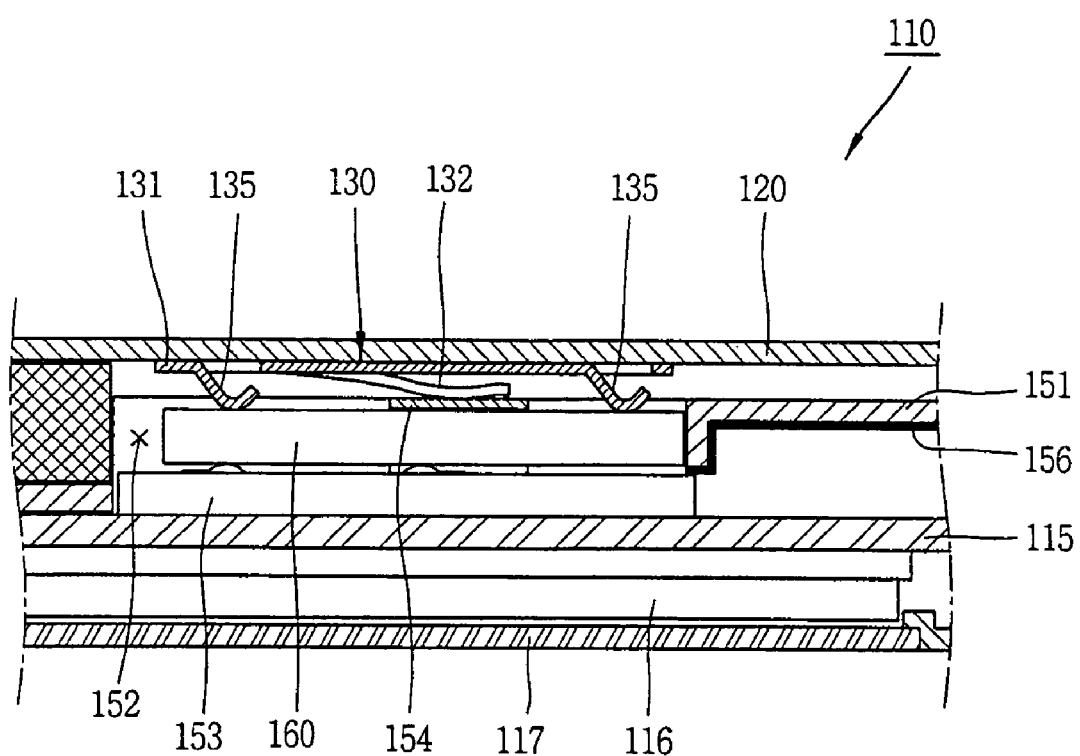
FIG. 6 is a sectional view showing a state where the cover of the mobile phone of FIG. 5 is mounted on the body.

As shown in FIGS. 5 and 6, a modification of the first exemplary embodiment shown in FIGS. 1-4 includes a pressurizing protrusion 135 for elastically pressing a card 160 towards a connector 153. The pressurizing protrusion 135 is curvedly formed at the grounding unit 130 and extends from the attachment portion 131 to protrude towards the card 160.

Accordingly, when the cover 120 is mounted on the body 111, an electric connection between the card 160 and the connector 153 is stably maintained. The pressurizing protrusion 135 is formed on the metallic plate with the grounding unit 130 to facilitate processing and fabrication of the grounding unit 130. The construction and operation of the mobile phone shown in FIGS. 5 and 6 is similar to that of the first embodiment. Also, similar reference numerals were given to the same components as those of the first embodiment, and thus detailed explanation thereof are omitted.

Figure 7:
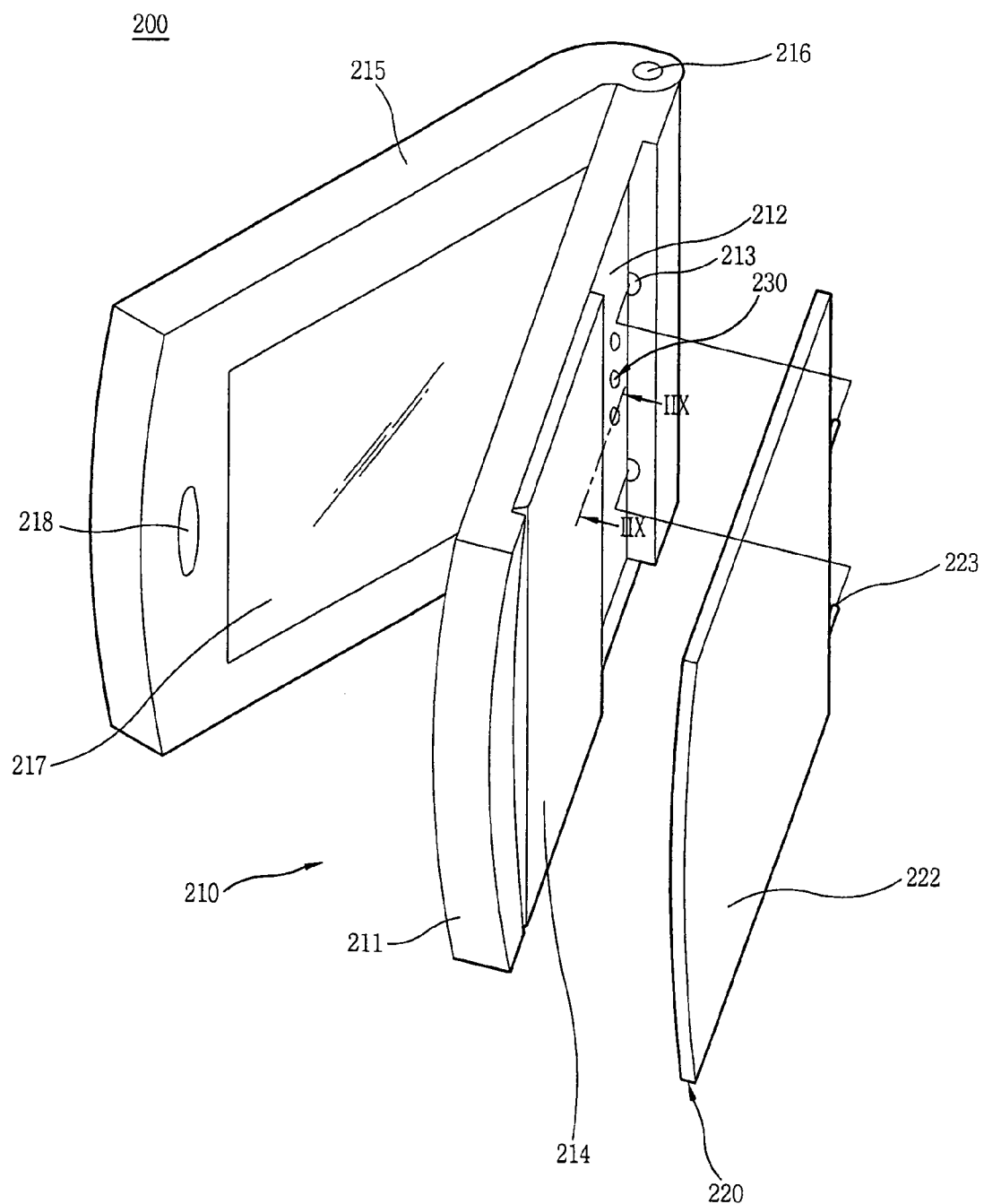
FIG. 7 is a disassembled perspective view showing a state where a cover is separated from a body of a mobile phone according to a second exemplary embodiment of the present invention.

FIG. 7 is a disassembled perspective view showing a second exemplary embodiment of the present invention in a state where a cover 220 is separated from a body 210 of a mobile phone 200. Similar to mobile phone 100 above, the second exemplary embodiment of the present invention is not limited to a mobile phone.

Referring to FIG. 7, the body 210 is formed as a folder type mobile phone in which a first body 211 and a second body 215 are rotatably connected to each other by a hinge 216. A display 217 for outputting video information and a speaker 218 for outputting audio information are provided at one surface of the second body 215. While the body 210 is shown as a folder type mobile phone, a bar type or a slide type mobile phone may be implemented according to the second exemplary embodiment.

A battery 214 is detachably mounted at a receiving portion 212 formed at a rear surface of the first body 211. The cover 220 is detachably coupled to the rear surface of the first body 211 so as to cover the battery 214. The cover 220 is formed of a metallic material. The cover 220 is coupled to the body 210 by a coupling groove 213 formed at the first body 211 and a coupling protrusion 223 formed at the cover 220. It is understood that the cover 220 may be coupled to body 210 using other conventional techniques.

Figure 8:
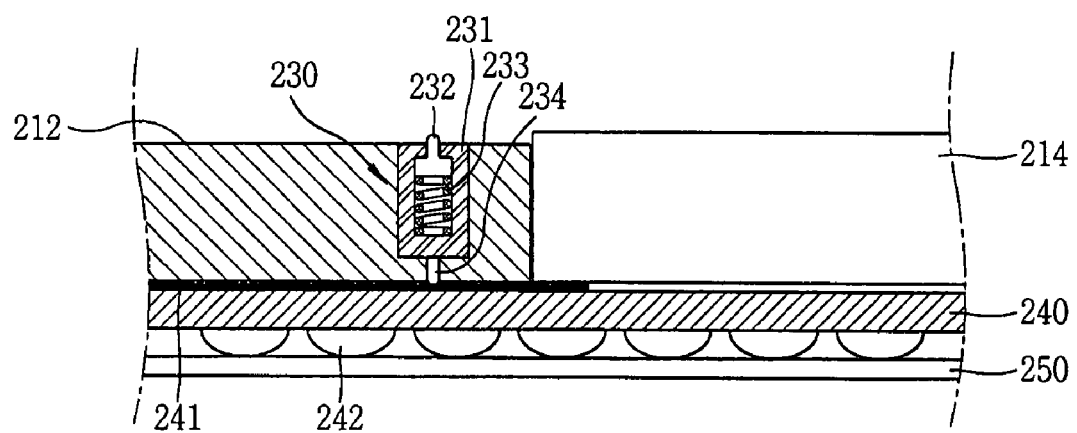
FIG. 8 is a sectional view taken along line IIX-IIX of FIG. 7.

As shown in FIG. 8, a grounding unit 230 for electrically connecting a ground portion 241 formed in the body 210, specifically first body 211, to the cover 220 is mounted in a portion that defines the receiving portion 212 of the first body 211. A single grounding unit 230, or more than one grounding unit, may be provided. The grounding unit 230 is arranged in the first body 211 (FIG. 7) such that one end thereof comes in contact with the ground portion 241 formed at the circuitry supporting substrate 240 and the other end comes in contact with cover 220 (not shown in FIG. 8).

The grounding unit 230 may be implemented as a pogopin. As such, the grounding unit 230 includes a housing 231 having an inner space, a connection rod 232 arranged at the inner space of the housing 231, an elastic member 233 arranged at the inner space for biasing the connection rod 232, and a contact pin 234 extending from the housing 231 to contact the ground 241. When the connection rod 232 is elastically displaced by the elastic member 233, it stably contacts the cover 220 shown in FIG. 7. Accordingly, the ground 241 is stably connected to the cover 220 through the grounding unit 230, which extends towards and contacts the cover 220, thereby preventing a lowering of a wireless communication characteristic of the mobile phone 200 due to characteristics of the metallic cover 220. Also, because of the electric connection between the ground 241 and the metallic cover 220, protection against static electricity buildup by the mobile phone is improved.

Figure 9:
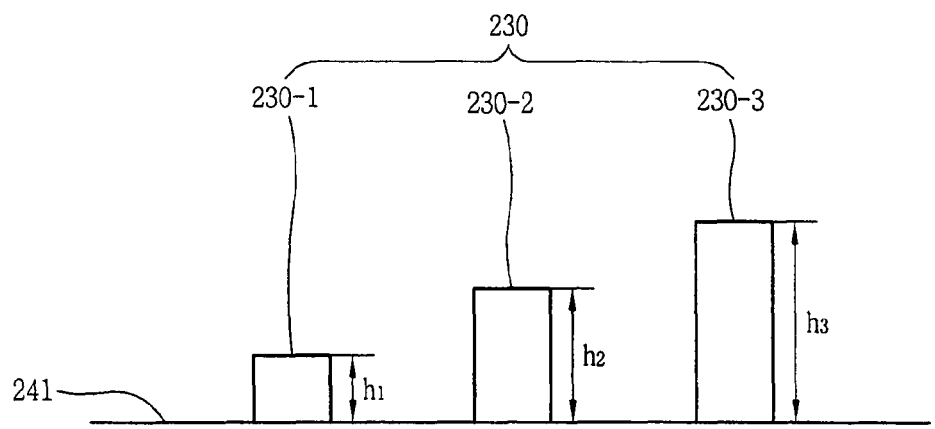
FIG. 9 is a schematic showing different heights of three grounding units of FIG. 7.

FIG. 9 is a schematic view showing different heights of three grounding units 230 of FIG. 7. As shown in FIG. 9, the grounding units 230 include three grounding units 230-1, 230-2, and 230-3 having different heights h1 to h3, respectively.

When the cover 220 is coupled to the first body 211 shown in FIG. 7 and contacts the second grounding unit 230-2, an electric connection between the ground 241 and the cover 220 is stably maintained by the second and third grounding units 230-2 and 230-3. When the cover 220 is coupled to the first body 211 and contacts the third grounding unit 230-3, an electric connection between the ground 241 and the cover 220 is stably maintained by the third grounding unit 230-3. And when the cover 220 is coupled to the first body 211 and contacts the first grounding unit 230-1, an electric connection between the ground 241 and the cover 220 is stably maintained by the first to third grounding units 230-1 to 230-3. Because of the different heights of the grounding units 230-1 to 230-3, the electric connection between the ground 241 and the cover 220 can be stably maintained even if the first body 211 and the cover 220 are coupled to each other with a different gap therebetween.

Figure 10:
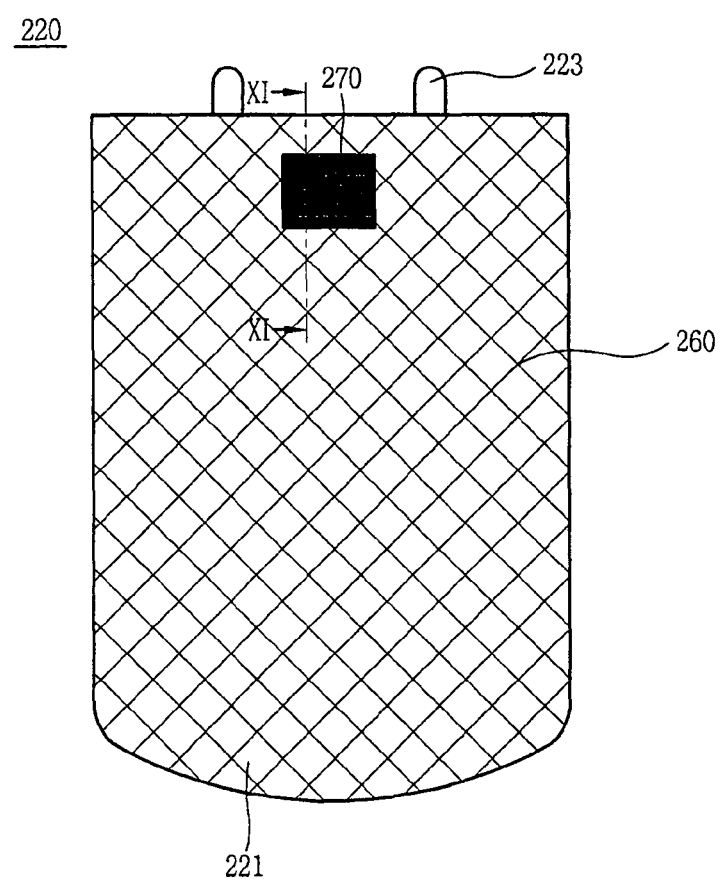
FIG. 10 is a frontal view showing an inner surface of the cover of FIG. 7.
Figure 11:
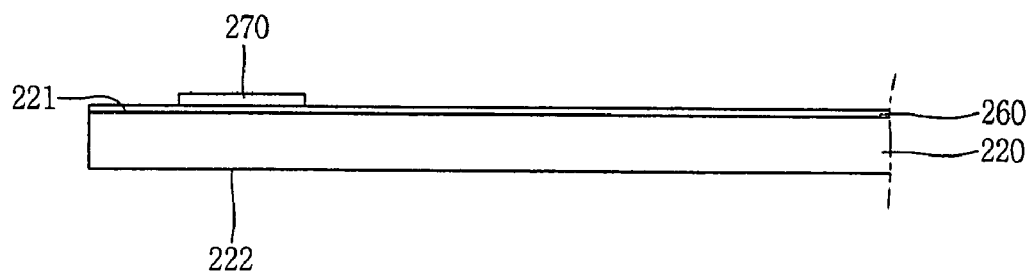
FIG. 11 is a sectional view taken along line XI-XI of FIG. 10.

With respect to FIGS. 10 and 11, a construction for preventing a current leakage will be explained. Since current leakage occurs because of alternating current, when the mobile phone 200 is operated by a direct current supplied from the battery 214 shown in FIG. 7 the mobile phone 200 does not have a problem with current leakage. However, mobile phone 200 does have a problem with current leakage when an alternating current supplied by a charger (not shown) for charging the battery 214 is connected thereto.

In order to solve the current leakage at the time of charging the mobile phone, an insulating layer 260 is formed at an inner surface of the cover 220 facing the first body 211. The insulating layer 260 is formed by coating an insulating material or by attaching an insulating tape onto the inner surface 221 of the metallic cover 220. Because of the insulating layer 260, current leakage that occurs when the mobile phone 200 is charged is not transmitted to the cover 220, but instead the cover 220 is shielded by the insulating layer 260. Accordingly, even if a user touches an outer surface 222 of the cover 220 of the mobile phone 200, an electric shock due to current leakage does not occur. As a result, the user can safely use the mobile phone 200, and the outer surface 222 of the cover 220 can be exposed and an additional process such as painting with an insulating material on the outer surface 222 is not required. Furthermore, static electricity applied to the mobile phone 200 through the cover 220 is absorbed to the cover 220 by the insulating layer 260.

A ground layer 270 may be formed on the insulating layer 260. For example, the ground layer 270 may be formed as a conductive tape that contacts the grounding unit 230 shown in FIG. 7. Accordingly, a static electricity having a capacity greater than a certain degree absorbable by the cover 220 is transferred to the ground layer 270 from the cover 220. Then, the ground portion 241 shown in FIG. 8 absorbs the static electricity.

Figure 12:
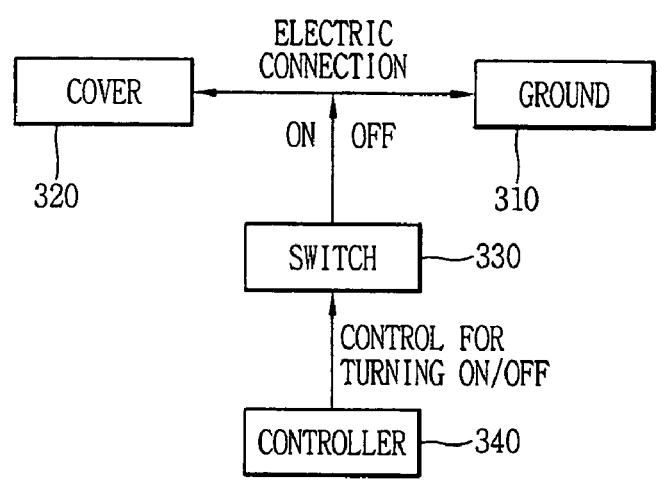
FIG. 12 is a flow diagram showing a control for an electric connection between a body and a cover of a mobile phone according to a third exemplary embodiment of the present invention.

FIG. 12 is a schematic diagram explaining a control method for an electric connection between a body and a cover of a mobile phone 300 according to a third exemplary embodiment of the present invention. A ground portion 310 and a cover 320 correspond to the ground portions 15a and 241 and the covers 20, 120, and 220 of the aforementioned embodiments, respectively. Also, the ground portion 310 and the cover 320 are electrically connected to each other by the aforementioned grounding units 30, 130, and 230 either directly or via the terminal unit 50.

The electric connection between the cover 320 and the ground 310 is maintained (on) or released (off) by a switch 330 disposed on a connection line therebetween. Generally, it is preferable to electrically connect the ground 310 to the metallic cover 320 so as to prevent a lowering of a wireless communication characteristic of the mobile phone 300. However, the opposite arrangement may be required according to a structural factor such as an arrangement of an antenna (not shown) with respect to the cover 320. In the second instance, the electric connection between the ground 310 and the cover 320 is released by the switch 330.

The switch 330 is turned on or turned off by a controller 340 electrically connected thereto. In a communication state, the controller 340 turns on or off the switch 330 according to an influence of the electric connection between the ground 310 and the cover 320 on a wireless communication characteristic. That is, if it is desirable to electrically connect the ground 310 to the cover 320 with respect to an arrangement of an antenna, the switch 330 is turned on in a communication state of the mobile phone 300, and vice versa. Furthermore, in a non-communication state (stand-by state), the controller 340 turns-on the switch 330 thus to electrically connect the ground 310 to the cover 320. Accordingly, in a stand-by state of the mobile phone 300, protection against static electricity is improved. When the mobile phone 300 is charged, the controller 340 turns off the switch 330. Accordingly, a current leakage through the cover 320 due to an alternating current occurring when the mobile phone is charged is prevented.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A mobile phone, comprising:
a body having a ground portion;
a metallic cover detachably coupled to the body, the metallic cover forming an exterior surface of the mobile phone; and
a grounding unit configured to electrically connect the ground portion of the body to the metallic cover when the metallic cover is coupled to the body, the grounding unit being disposed on one of facing surfaces of the body and the metallic cover,
wherein the grounding unit includes:
an attachment portion located on an inner surface of the metallic cover facing the body; and
an elastic extension portion extending from the attachment portion towards the body.

2. The mobile phone of claim 1, further comprising a battery mounted on the body, the metallic cover being a battery cover.

3. The mobile phone of claim 1, further comprising:
a terminal unit mounted at the body and electrically connected to the ground portion, the terminal unit being formed of metallic material,
wherein the grounding unit connects the ground portion to the metallic cover through the terminal unit.

4. The mobile phone of claim 3, further comprising:
a circuitry supporting substrate attached at the body; and
a conductive film formed on a surface of the body,
wherein the ground portion is formed on the circuitry supporting substrate and the conductive film electrically connects the ground portion and the terminal unit.

5. The mobile phone of claim 3, wherein the grounding unit comprises:
the attachment portion located on the inner surface of the metallic cover facing the terminal unit; and
the elastic extension portion extending from the attachment portion towards the terminal unit,
wherein the elastic extension portion is elastically displaced towards the metallic cover when contacting the terminal unit.

6. The mobile phone of claim 5, wherein the elastic extension portion includes a protrusion extending towards the terminal unit.

7. The mobile phone of claim 5, wherein the grounding unit is a metallic plate divided into at least the attachment portion and the elastic extension portion by at least one slot.

8. The mobile phone of claim 7, wherein the attachment portion is fixed to the metallic cover by welding.

9. The mobile phone of claim 7, wherein the terminal unit is a card socket mounted on the body, the card socket including:
   a connector; and
   a metallic holder for receiving a card, the metallic holder being connected to the ground portion of the body.

10. The mobile phone of claim 9, further comprising a pressing protrusion for elastically pressing the card received in the holder towards the connector.

11. The mobile phone of claim 10, wherein the pressing protrusion is formed on the attachment portion and curvedly extends towards the card.

12. The mobile phone of claim 1, further comprising a switch for electrically connecting or disconnecting the metallic cover and the ground portion to or from each other.

13. The mobile phone of claim 12, wherein when the switch is in the on position, the metallic cover and ground portion are electrically connected to each other, and when the switch is in the off position, the metallic cover and ground portion are electrically disconnected from each other, the switch being moveable between the on and off positions in response to a wireless communication characteristic of the mobile phone.

14. The mobile phone of claim 13, wherein the switch is on when the mobile phone is in a non-communication state, and the switch is off when the mobile phone is in a charge state.

15. The mobile phone of claim 1, wherein an insulating layer is formed on an inner surface of the metallic cover facing the body.

16. The mobile phone of claim 15, wherein the grounding unit is disposed at the inner surface of the metallic cover so as to be arranged on the insulating layer.

17. The mobile phone of claim 15, wherein the insulating layer is formed by coating with an insulating material or attaching an insulating tape.

18. The mobile phone of claim 1, wherein the elastic extension portion includes a protrusion extending towards the body.

19. The mobile phone of claim 1, wherein the grounding unit is a metallic plate divided into at least the attachment portion and the elastic extension portion by at least one slot.

20. The mobile phone of claim 1, wherein the attachment portion is fixed to the metallic cover by welding.

21. A mobile phone comprising:
   a body having a ground portion;
   a metallic cover detachably coupled to the body, the metallic cover forming an exterior surface of the mobile phone; and
   a grounding unit configured to electrically connect the ground portion of the body to the metallic cover when the metallic cover is coupled to the body, the grounding unit being disposed on one of facing surfaces of the body and the metallic cover,
   wherein the grounding unit includes at least one pogo-pin mounted at the body, the at least one pogo-pin having one end contacting the ground portion and another end elastically displaced towards the metallic cover.

22. The mobile phone of claim 21, wherein the at least one pogo-pin includes a plurality of pogo-pins, and each of the plurality of pogo-pins has a different height.

* * * * *